United States Patent [19]

Eitan

[11] Patent Number: 5,768,192

[45] Date of Patent: Jun. 16, 1998

[54] NON-VOLATILE SEMICONDUCTOR MEMORY CELL UTILIZING ASYMMETRICAL CHARGE TRAPPING

[75] Inventor: Boaz Eitan, Ra'anana, Israel

[73] Assignee: Saifun Semiconductors, Ltd., Ra'anana, Israel

[21] Appl. No.: 681,430

[22] Filed: Jul. 23, 1996

[51] Int. Cl.[6] ................................................. G11C 11/34
[52] U.S. Cl. ........................... 365/185.24; 365/185.01; 365/185.28; 365/185.14; 365/185.26; 365/182
[58] Field of Search .................................. 365/182, 184, 365/185.01, 189.12, 185.24, 185.28, 185.14, 185.26

[56] References Cited

U.S. PATENT DOCUMENTS

| 4,527,257 | 7/1985 | Cricchi | 365/184 |
| 5,168,334 | 12/1992 | Mitchell et al. | |
| 5,426,605 | 6/1995 | Van Berkel et al. | 365/182 |

OTHER PUBLICATIONS (Article) Chan, T.Y. et al, "A True Single–Transistor Oxide–Nitride–Oxide EEPROM Device," *IEEE Electron Device Letters*, vol. EDL–8, No. 3, Mar. 1987, (3 pages).
(Article) Etian et al, "Hot–Elecron Injection into the Oxide in n–Channel MOS Devices," *IEEE Transactions on Electron Devices*, vol. ED–38, No. 3, Mar. 1981, pp. 328–340.

(Book) Glasser L.A. et al, *The Design and Analysis of VLSI Circuits*. Addison–Wesley Publishing Co., 1988, Chapter 2.

*Primary Examiner*—Viet Q. Nguyen
*Attorney, Agent, or Firm*—Skjerven, Morrill, MacPherson, Franklin & Friel LLP; Howard Zaretsky

[57] ABSTRACT

A novel apparatus for and method of programming and reading a programmable read only memory (PRON) having a trapping dielectric sandwiched between two silicon dioxide layers is disclosed that greatly reduces the programming time of conventional PROM devices. Examples of the trapping dielectric are silicon oxide-silicon nitride-silicon oxide (ONO) and silicon dioxide with buried polysilicon islands. A nonconducting dielectric layer functions as an electrical charge trapping medium. This charge trapping layer is sandwiched between two layers of silicon dioxide acting as an electrical insulator. A conducting gate layer is placed over the upper silicon dioxide layer. The memory device is programmed in the conventional manner, using hot electron programming, by applying programming voltages to the gate and the drain while the source is grounded. Hot electrons are accelerated sufficiently to be injected into the region of the trapping dielectric layer near the drain. The device, however, is read in the opposite direction from which it was written, meaning voltages are applied to the gate and the source while the drain is grounded. For the same applied gate voltage, reading in the reverse direction greatly reduces the potential across the trapped charge region. This permits much shorter programming times by amplifying the effect of the charge trapped in the localized trapping region.

40 Claims, 5 Drawing Sheets

NON-VOLATILE SEMICONDUCTOR MEMORY CELL UTILIZING ASYMMETRICAL CHARGE TRAPPING

FIELD OF THE INVENTION

The present invention relates generally to semiconductor memory devices and more particularly to a programmable read only memory (PROM) cell having charge trapping dielectric material in the gate.

BACKGROUND OF THE INVENTION

Memory devices for non-volatile storage of information are currently in widespread use today, being used in a myriad of applications. A few examples of non-volatile semiconductor memory include read only memory (ROM), PROM, erasable programmable read only memory (EPROM), electrically erasable programmable read only memory (EEPROM) and flash EEPROM.

Semiconductor ROM devices, however, suffer from the disadvantage of not being electrically programmable memory devices. The programing of a ROM occurs during one of the steps of manufacture using special masks containing the data to be stored. Thus, the entire contents of a ROM must be determined before manufacture. In addition, because ROM devices are programmed during manufacture, the time delay before the finished product is available could be six weeks or more. The advantage, however, of using ROM for data storage is the low cost per device. However, the penalty is the inability to change the data once the masks are committed to. If mistakes in the data programing are found they are typically very costly to correct. Any inventory that exists having incorrect data programming is instantly obsolete and probably cannot be used. In addition, extensive time delays are incurred because new masks must first be generated from scratch and the entire manufacturing process repeated. Also, the cost savings in the use of ROM memories only exist if large quantities of the ROM are produced.

Moving to EPROM semiconductor devices eliminates the necessity of mask programming the data but the complexity of the process increases drastically. In addition, the die size is larger due to the addition of programming circuitry and there are more processing and testing steps involved in the manufacture of these types of memory devices. An advantage of EPROMs are that they are electrically programmed, but for erasing, EPROMs require exposure to ultraviolet (UV) light. These devices are constructed with windows transparent to UV light to allow the die to be exposed for erasing, which must be performed before the device can be programmed. A major drawback to these devices is that they lack the ability to be electrically erased. In many circuit designs it is desirable to have a nonvolatile memory device that can be erased and reprogrammed in-circuit, without the need to remove the device for erasing and reprogramming.

Semiconductor PROM devices also involve more complex processing and testing procedures than ROM, but have the advantage of electrical programming and erasing. Using PROM devices in circuitry permits in-circuit erasing and reprogramming of the device, a feat not possible with conventional EPROM memory. Flash EEPROMs are similar to EEPROM in that memory cells can be programmed (i.e., written) and erased electrically but with the additional ability of erasing all memory cells at once, hence the term flash EEPROM. The disadvantage of flash EEPROM is that it is very difficult and expensive to manufacture and produce.

The widespread use of EEPROM semiconductor memory has prompted much research focusing on improving current technology. Active areas of research have focused on developing an EEPROM memory cell that has improved performance characteristics such as shorter programming times, utilizing lower voltages for programming and reading, longer data retention times, shorter erase times and smaller physical dimensions. The following prior art references are related to this area.

U.S. Pat. No. 5,168,334, issued to Mitchell et al., teaches a single transistor EEPROM memory cell. Oxide-nitride-oxide layers are formed above the channel area and between the bit lines for providing isolation between overlying polysilicon word lines. The nitride layer provides the charge retention mechanism for programming the memory cell.

A single transistor ONO EEPROM device is disclosed in the technical article entitled "A True Single-Transistor Oxide-Nitride-Oxide EEPROM Device," T. Y. Char, K .K. Young and Chenming Hu, IEEE Electron Device Letters, March 1987. The memory cell is programmed by hot electron injection and the injected charges are stored in the oxide-nitride-oxide (ONO) layer of the device.

SUMMARY OF THE INVENTION

Therefore, it is an object of the present invention to provide a semiconductor memory device that overcomes the disadvantages of the prior art devices.

It is another object of the present invention to provide a semiconductor memory device that can be programmed in significantly less time than prior art semiconductor memory devices by amplifying the effect of the trapped charge in the trapping dielectric.

Yet another object of the present invention is to provide a semiconductor memory device that when programmed exhibits far less leakage current during a read cycle tan prior art semiconductor memory devices.

Yet another object of the present invention is to provide a semiconductor memory device that is programmed by using hot electron channel injection to trap charge in the gate dielectric without the use of a floating gate.

The present invention discloses an apparatus for and method of programming and reading a programmable read only memory (PROM) having a trapping dielectric sandwiched between two silicon dioxide layers that greatly reduces the programming time of conventional PROM devices. Examples of the trapping dielectric are silicon oxide-silicon nitride-silicon oxide (ONO) and silicon dioxide with buried polysilicon islands. A nonconducting dielectric layer functions as an electrical charge trapping medium. This charge trapping layer is sandwiched between two layers of silicon dioxide acting as an electrical insulator. A conducting gate layer is placed over the upper silicon dioxide layer. The memory device is programmed in the conventional manner, using hot electron programming, by applying programming voltages to the gate and the drain while the source is grounded. Hot electrons are accelerated sufficiently to be injected into the region of the trapping dielectric layer near the drain. The device, however, is read in the opposite direction from which it was written, meaning voltages are applied to the gate and the source while the drain is grounded. For the same applied gate voltage, reading in the reverse direction greatly reduces the potential across the trapped charge region. This permits much shorter programming times by amplifying the effect of the charge trapped in the localized trapping region.

There is thus provided in accordance wit a preferred embodiment of the present invention, a programmable read only memory (PROM) device, comprising a semiconducting substrate, a source, the source comprising a region of the semiconducting substrate doped so as to be conductive, a drain, the drain comprising a region of the semiconducting substrate doped so as to be conductive, a first insulating layer overlaying and covering a portion of the semiconducting substrate located between the source and the drain deigned as the channel region, a nonconducting charge trapping layer formed on and overlaying the first insulating layer, a second insulating layer formed on and overlaying the nonconducting charge trapping layer, a gate, the gate comprising a conductive layer formed on and overlaying the second insulating layer, and wherein the memory device is read in the opposite direction from which it was programmed.

Further, a lower limit for the voltage applied to the gate during reading is the voltage at which sufficient inversion is generated whereby the unprogrammed state can be sensed, an upper limit for the voltage applied to the gate during reading is the voltage at which the voltage in a channel, formed between the source and the drain within the semiconducting substrate, across a region of trapped charge formed during programming, is just below the voltage applied to the source during reading.

In addition, programming comprises applying programming voltages to the drain and the gate, grounding the source and measuring the resulting channel current and reading comprises applying reading voltages to the source and the gate, grounding the drain and measuring the resulting channel current.

The first and second insulating layers comprise silicon dioxide and the charge trapping layer comprises silicon nitride.

Alternatively, the charge trapping layer comprises silicon dioxide with buried polysilicon islands. The semiconducting substrate comprises P-type semiconductor material and the source and the drain comprise N+ semiconductor material.

There is also provided in accordance wit a preferred embodiment of the present invention, a programmable read only memory (PROM) device, comprising a semiconducting substrate, a source, the source comprising a region of the semiconducting substrate doped so as to be conductive, a drain, the drain comprising a region of the semiconducting substrate doped so as to be conductive, a channel being formed in the space between the source and the drain within the semiconducting substrate, a first insulating layer overlaying and covering a portion of the semiconducting substrate located between the source and the drain defined as the channel region, a nonconducting charge trapping layer formed on and overlaying the first insulating layer, a second insulating layer formed on and overlaying the nonconducting charge trapping latter, a gate, the gate comprising a conductive layer formed on and overlaying the second insulating layer, wherein the memory device is read in the opposite direction from which it was programmed, and wherein a lower limit for the voltage applied to the gate during reading is the voltage at which sufficient inversion is generated whereby the unprogrammed state can be sensed, an upper limit for the voltage applied to the gate during reading is the voltage at which the voltage in the channel, across a region of trapped charge formed during programming, is just below the voltage applied to the source during reading.

Further, programming comprises applying programming voltages to the drain and the gate, grounding the source and measuring the resulting channel current and wherein reading comprises applying reading voltage to the source and the gate, grounding the drain and measuring the resulting channel current.

In addition, there is provided in accordance with a preferred embodiment of the present invention, a method of programming and reading a programmable read only memory (PROM) cell, the PROM cell having a source, drain and gate and utilizing a charge trapping material sandwiched between a first and second silicon dioxide layer within the gate, the method comprising the steps of programming in the forward direction which includes: injecting electrical charge into the charge trapping material within the gate utilizing hot electron injection for a sufficient time duration such that electrical charge becomes trapped asymmetrically in the charge trapping material, the electrical charge being injected until the threshold voltage of the gate reaches a predetermined level when the PROM cell is read in the reverse direction from which it was programmed, the asymmetrical charge injection generated by applying suitable programming voltages to the drain and the gate and grounding the source, and reading in the reverse direction which includes: applying suitable read voltages to the source and the gate and grounding the drain, and sensing current flowing through the PROM cell from the source to the drain, A lower limit for the voltage applied to the gate during reading in the reverse direction is the voltage at which sufficient inversion is generated whereby the unprogrammed state can be sensed, an upper limit for the voltage applied to the gate during reading in the reverse direction is the voltage at which the voltage in a channel, formed between the source and the drain within the semiconducting substrate, across a region of trapped charge formed during programming, is just below the voltage applied to the source during reading in the reverse direction.

Further, there is provided in accordance with a preferred embodiment of the present invention, a method of programming and reading a programmable read only memory (PROM) cell, the PROM cell having a semiconducting substrate, threshold voltage, first junction, second junction and gate and utilizing a charge trapping material sandwiched between a first and second silicon dioxide layer within the gate, the method comprising the steps of programming in the forward direction which includes; applying a first programming voltage to the gate, applying a second programming voltage to the second junction, coupling the first junction to a ground, injecting electrical charge into the charge trapping material within the gate utilizing hot electron injection for a sufficient time duration such that electrical charge becomes trapped asymmetrically in the charge trapping layer in close vicinity to the second junction, injecting electrical charge into the charge trapping material until the threshold voltage of the gate reaches a predetermined level when the PROM cell is read in the reverse direction from which it was programmed, reading in the reverse direction which includes: applying a first read voltage to the gate, applying a second read voltage to the first junction, coupling the second junction to the ground, sensing current flowing through the PROM cell from the source to the drain, and wherein a lower limit for the first read voltage is the voltage at which sufficient inversion is generated whereby the unprogrammed state can be sensed, an upper limit for the first read voltage is the voltage at which the voltage in a channel, formed between the source and the drain within the semiconducting substrate, across a region of trapped charge formed during programming, is just below the second read voltage.

In addition, there is provided in accordance with a preferred embodiment of the present invention, a method of programming and reading a programmable read only memory (PROM) cell, the PROM cell having a semiconducting substrate, source, drain and gate and utilizing a charge trapping material sandwiched between a first and second silicon dioxide layer within the gate, the method comprising the steps of: programming in a first direction, and reading in a second direction opposite that of the first direction.

BRIEF DESCRIPTION OF THE DRAWINGS

The invention is herein described, by way of example only, with reference to the accompanying drawings, wherein.

DETAILED DESCRIPTION OF THE INVENTION

Figure 1:
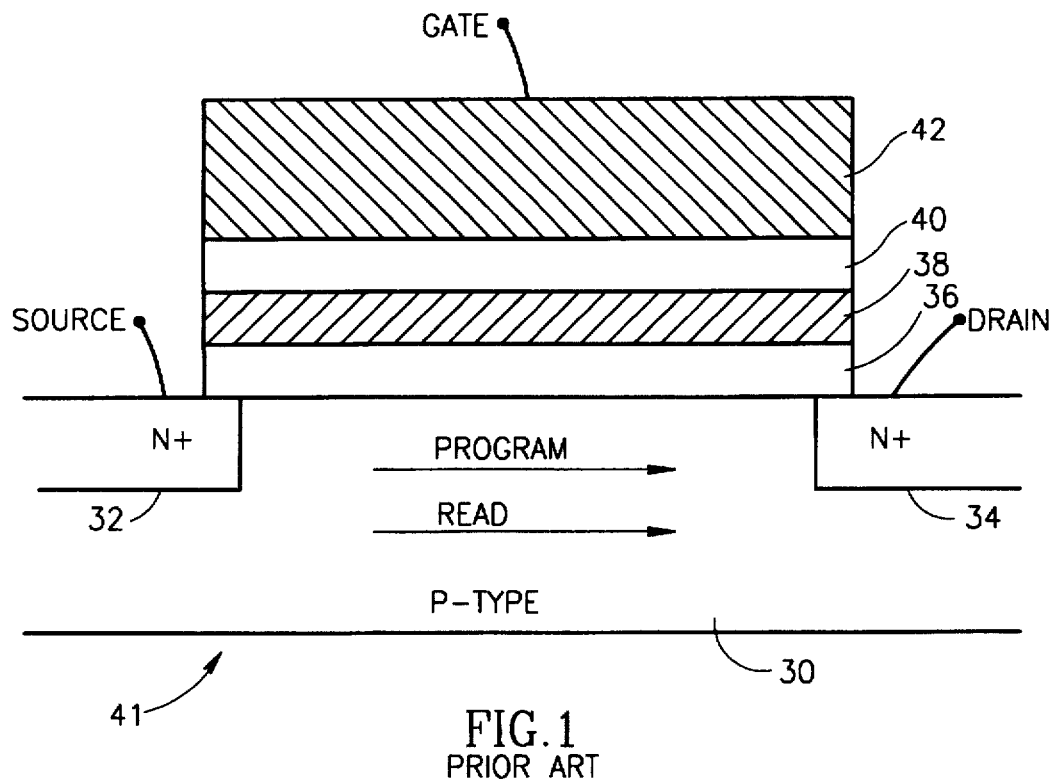
FIG. 1 illustrates a sectional view of a PROM cell of the prior art utilizing Oxide-Nitride-Oxide (ONO) as the gate dielectric.

The present invention can best be understood with an understanding of how present day charge trapping dielectric PROM memory cells ate constructed, programmed and read. Thus, a short introduction is presented describing prior art ONO EEPROM memory cells, a type of trapping dielectric PROM cell, and the conventional method used to program and read them. Illustrated in FIG. 1 is a cross section of a conventional ONO EEPROM memory cell as disclosed in the technic article entitled "A True Single-Transistor Oxide-Nitride-Oxide EEPROM Device,"T. Y. Chan, K. K. Young and Chenming Hu, IEEE Electron Device Letters, March 1987. The memory cell, generally referenced 41, comprises a P-type silicon substrate 30, two N+ junctions 32, 34, a nonconducting nitride layer 38 sandwiched between two oxide layers 36, 40 and a polycrystalline conducting layer 42.

Programming Prior Art Memory Devices

The operation of the prior arc memory cell 41 will now be described. To program or write the cell, voltages are applied to the drain 34 and the gate 42 and the source 32 is grounded. For example, 10 V is applied to the gate and 9 V is applied to the drain. These voltages generate a vertical and lateral electric field along the length of the channel from the source to the drain. This electric field causes electrons to be drawn off the source and begin accelerating towards the drain. As they move along the length of the channel, they gain energy. If they gain enough energy they are able to jump over the potential barrier of the oxide layer 36 into the silicon nitride layer 38 and become trapped. The probability of this occurring is a maximum in the region of the gate next to the drain 34 because it is near the drain that the electrons gain the most energy. These accelerated electrons are termed hot electrons and once injected into the nitride layer they become trapped and remain stored there. The trapped electrons cannot spread through the nitride layer because of the low conductivity of the nitride layer and the lateral electric field. Thus, the trapped charge remains in a localized trapping region typically located close to the drain.

In memory cells constructed using a conductive floating gate, the charge that gets injected into the gate is distributed equally across the entire gate. The threshold of the entire gate starts to increase as more and more charge is injected into the gate. The threshold voltage increases because the electrons that become stored in the gate screen the gate voltage from the channel.

With reference to FIG. 1, in devices with low or nonconductive gates, the injection of hot electrons into the silicon nitride layer causes the gate threshold voltage only in the localized trapping region to increase. This is in contrast to the conductive floating gate memory cells of EPROMs and EEPROMs wherein the gate threshold voltage of the entire channel rises as program time increases. In both conductive and nonconductive gate memory cell designs, an increase in the gate threshold voltage causes the current flowing through the channel to decrease. This reduces programming efficiency by lengthening the programming time. However, due to the localized electron trapping in the nonconductive memory cell design, the programming time is reduced less then with the conductive floating gate memory cell design. The technique of programming PROM memory cells with either conductive or low or nonconductive gates is well known in the art and is currently used to program EEPROM and flash EEPROM memory cells.

Reading Prior Art Memory Devices

The method of reading the prior art PROM memory cells will now be described. The conventional technique of reading both prior art conductive floating gate and nonconductive localized trapping gate EEPROM or flash EEPROM memory is to apply read voltages to the gate and drain and ground the source. This is similar to the method of programming with the difference being that lower level voltages are applied during read than during programming. Since the floating gate is conductive, the trapped charge is distributed evenly throughout the entire floating conductor. In a programmed device, the threshold is therefore high for the entire channel and the process of reading becomes symmetrically. It makes no difference whether voltage is applied to the drain and the source is grounded or vice versa. A similar process is also used to read prior art nonconductive localized gate PROM devices.

The process of programming typically includes writing followed by reading. This is true for all EPROM and EEPROM memory devices. A short programming pulse is applied to the device followed by a read. The read is actually used to effectively measure the gate threshold voltage. By convention, the gate threshold voltage is measured by applying a voltage to the drain and the gate, with the voltage on the gate being increased from zero while the channel current flowing from drain to source is measured. The gate voltage that provides 1 μA' of channel current is termed the threshold voltage.

Typically, programming pulses (i.e., write pulses) are followed by read cycles wherein the read is performed in the same direction that the programming pulse is applied. This is termed symmetrically programing and reading. Programming stops when the gate threshold voltage has reached a certain predetermined point (i.e., the channel current is reduced to a sufficiently low level). This point is chosen to ensure that a '0' bit can be distinguished foam a '1' bit and that a certain data retention time has been achieved.

The Memory Device of the Present Invention

Figure 2:
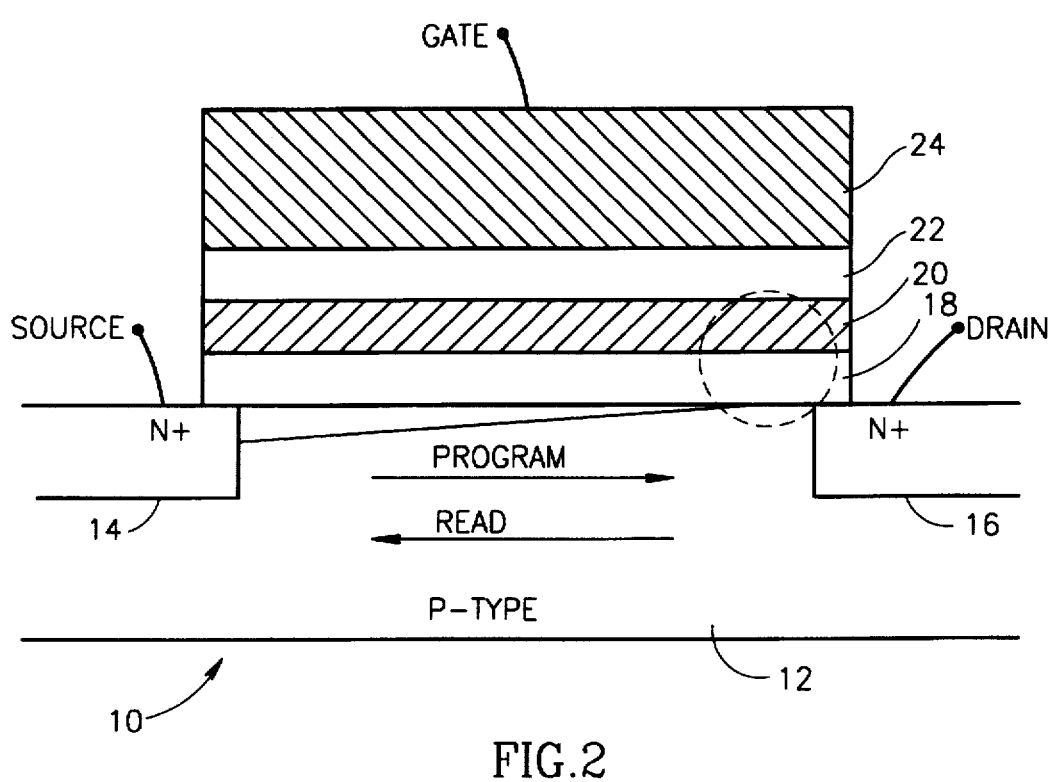
FIG. 2 illustrates a sectional view of a PROM cell constructed in accordance with a preferred embodiment of the present invention utilizing ONO as the gate dielectric.

The PROM memory cell, generally referenced 10, of the present invention is illustrated in FIG. 2. A P-type substrate 12 has two buried N+ junctions, one being the source 14 and the other being the drain 16. Above the channel is a layer of silicon dioxide 18, preferably between approximately 80-100 angstroms thick, which forms an electrical isolation layer over the channel. On top of the silicon dioxide layer 18 is a silicon nitride layer 20 preferably approximately 100 angstroms thick. This silicon nitride layer forms the memory retention layer functioning to trap the hot electrons as they are injected into the nitride layer. Another layer of silicon dioxide 22 is formed over the silicon nitride layer and is preferably between approximately 80-100 angstroms thick. The silicon dioxide layer 22 functions to electrically isolate a conductive gate 24 formed over the silicon dioxide layer 22. The layer forming the gate 24 can be constructed from polycrystalline silicon, commonly known as polysilicon.

The key aspect of the present invention lies in the manner in which the PROM memory cell 10 is programmed and read. Rather than performing symmetrical programming and reading, the PROM memory cell of the present invention is programmed and read asymmetrically. This means that programming and reading occur in opposite directions. The arrows labeled PROGRAM and READ in FIG. 2 point in opposite directions to signify this asymmetry. Thus, programming is performed in what is termed the forward direction and reading is performed in what is termed the opposite or backward direction.

Programming in the Forward Direction

As previously mentioned, the PROM memory cell 10 is programmed similarly to the prior art PROM memory cell of FIG. 1. Voltages are applied to the gate and drain creating vertical and lateral electrical fields which accelerate the electrons along the length of the channel. As the electrons move along the channel some of them gain sufficient energy to jump over the potential barrier of the bottom silicon dioxide layer 18 and become trapped in the silicon nitride layer 20. The electron trapping occurs in a region near the drain indicated by the dashed circle in FIG. 2. Electrons are trapped near the drain region because the electric fields are the strongest there, thus the electrons have a maximum probability of being sufficiently energized to jump the potential barrier and become trapped in the nitride layer. The threshold voltage of the portion of the gate over the trapped charge increases as more and electrons are injected into the nitride layer.

Reading in the Forward Direction

If the PROM memory cell 10 is read using the conventional technique of reading in the same direction as programming, the time needed to program the device greatly increases. Reading in the same direction as programming means the device is programmed and read in the same forward direction. During a read, voltages having levels lower than that during programming are applied to the gate and drain and the channel current is sensed. If the device is programmed (i.e., a '0') the channel current should be very low and if the device is not programmed (i.e., a '1') there should be significant channel current generated. Preferably, the difference in the channel current between the '0' and '1' states should be maximized in order to distinguish between the '0' and '1' states.

Figure 3:
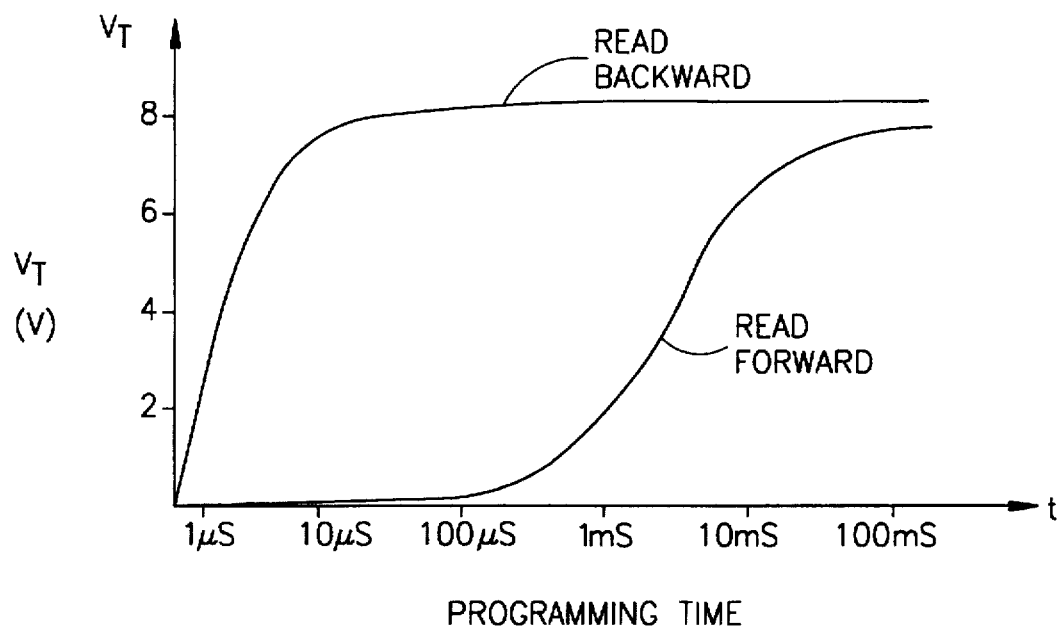
FIG. 3 is a chart illustrating the threshold voltage of a PROM cell of the present invention as a function of programming time for reading in the forward and backward directions.

Illustrated in FIG. 3 is a graph showing the rise in gate threshold voltage as a function of programming time for reading in the forward direction (curve labeled READ FORWARD) and for reading in the backward direction (curve labeled READ BACKWARD). Apparent from the graph in FIG. 3 is the several orders of magnitude reduction in programming time achieved when reading in the backward or reverse direction versus reading in the forward direction. As will be described in more detail below, this dramatic reduction in programing time is due to amplification of the effect of the trapped charge injected into the nitride layer brought about by reading the memory cell device in the opposite direction from which it was programmed.

Figure 4:
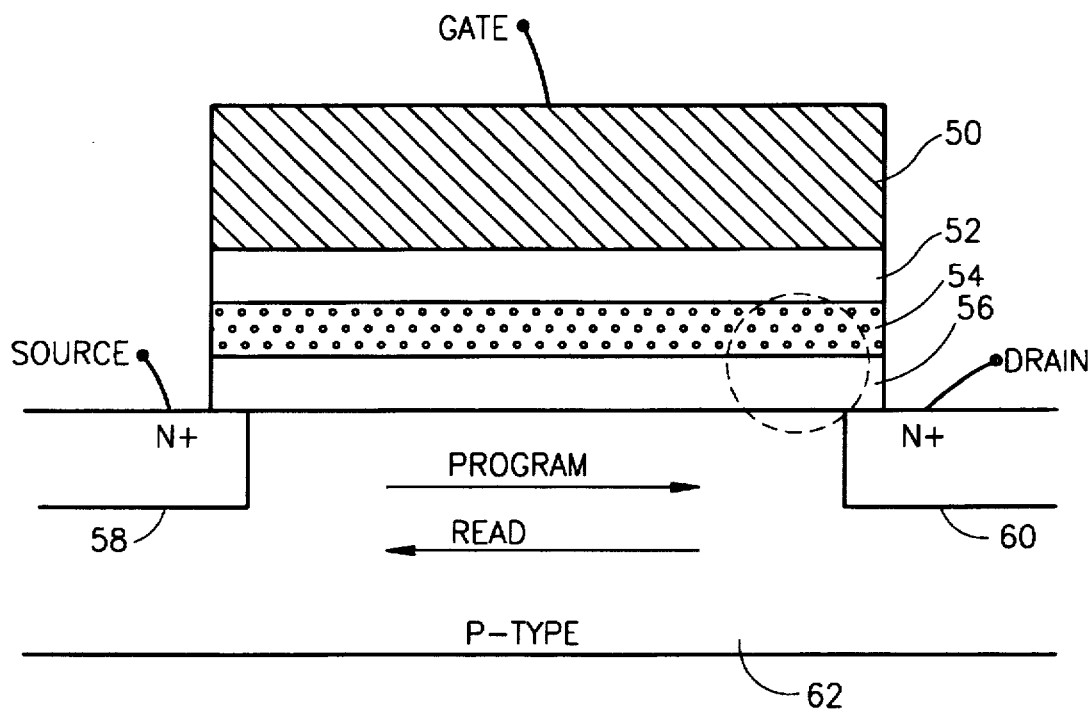
FIG. 4 illustrates a sectional view of a PROM cell constructed in accordance with a preferred embodiment of the present invention utilizing a silicon rich silicon dioxide with buried polysilicon islands as the gate dielectric.

Charge trapping dielectric materials other then nitride may also be suitable for use as an asymmetric charge trapping medium. One such material is silicon dioxide with buried polysilicon islands. The silicon dioxide with polysilicon islands is sandwiched between two layers of oxide in similar fashion to the construction of the ONO memory cell. A sectional view of a PROM cell constructed in accordance with a preferred embodiment of the present invention utilizing a silicon rich silicon dioxide with buried polysilicon islands as the gate dielectric is illustrated in FIG. 4. A P-type substrate 62 has buried N+ source 58 and drain 60 regions. The silicon dioxide with buried polysilicon islands layer 54 is sandwiched between two layers of oxide 52, 56. Covering oxide layer 52 is polysilicon gate 50. The operation of the memory cell of FIG. 4 is similar to that of the memory cell illustrated in FIG. 2 with programming and reading occurring in opposite directions.

Figure 5A:
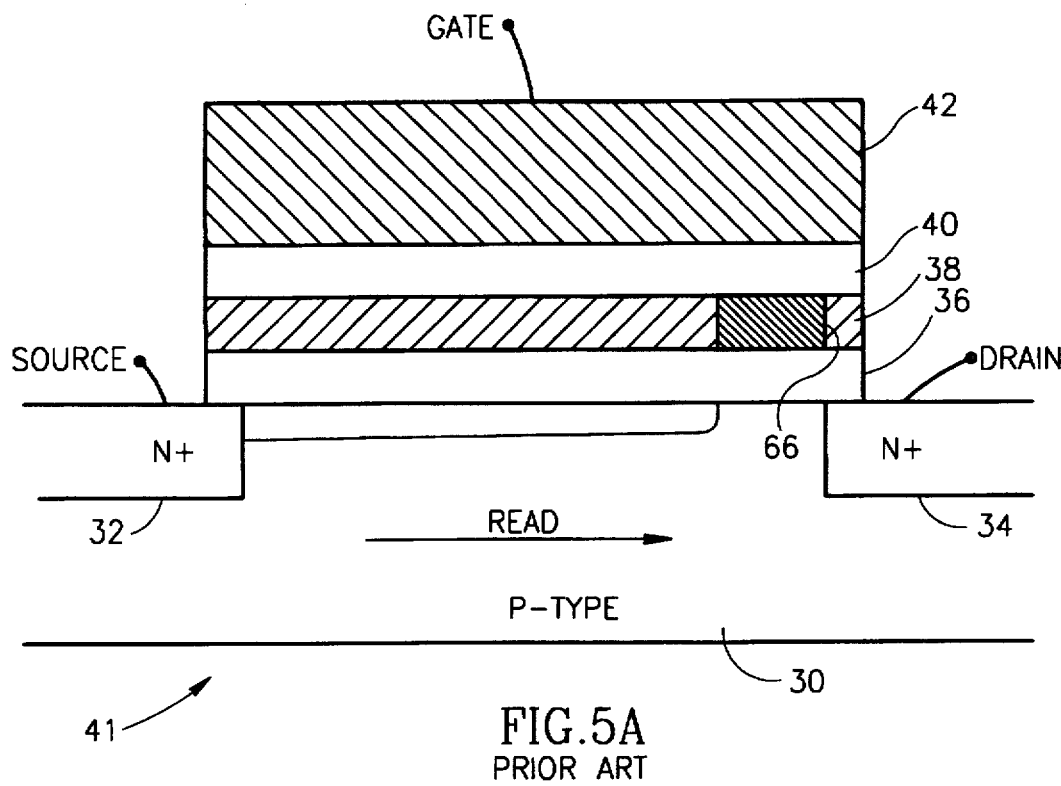
FIG. 5A illustrates a sectional view of a PROM cell of the prior art showing the area of charge trapping under the gate.
Figure 5B:
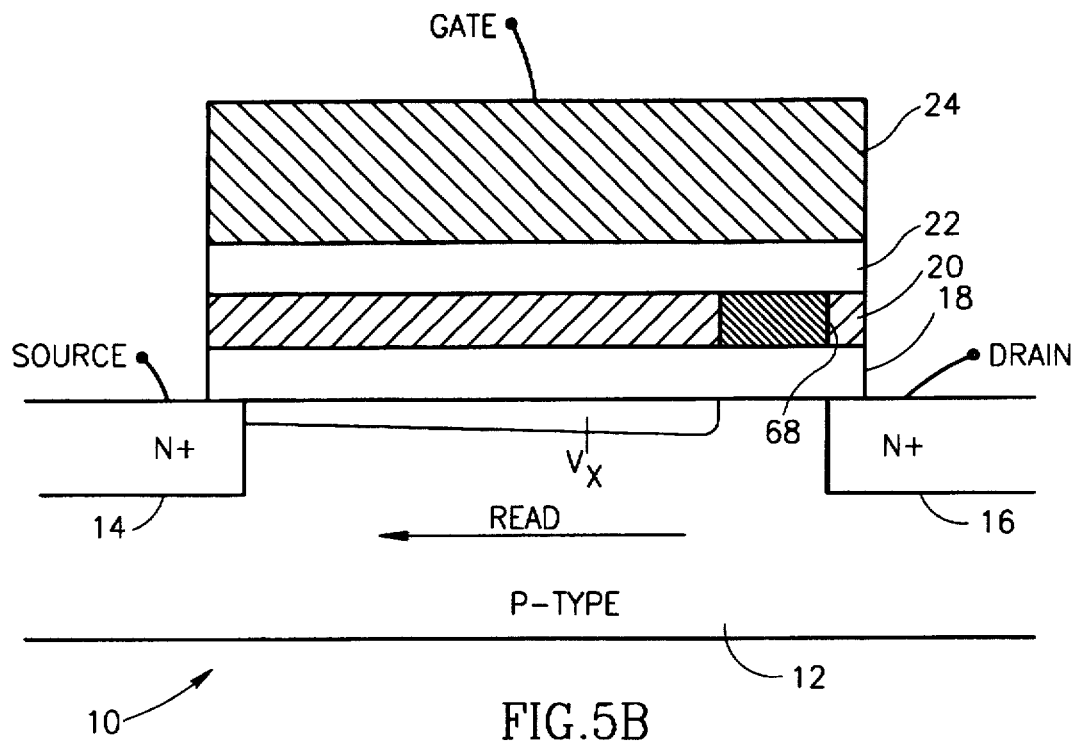
FIG. 5B illustrates a sectional view of a PROM cell constructed in accordance with a preferred embodiment of the present invention showing the area of charge trapping under the gate.

As stated above, the time needed to program the PROM memory cell greatly increases when the reading occurs in the same direction (i.e., the forward direction) as it was written or programmed. The reason for this will now be explained in more detail with reference to Figure 5A and 5B. FIG. 5A illustrates a sectional view of PROM cell of a the prior art showing the area of charge trapping under the gate and FIG. 5B illustrates a sectional view of a PROM cell constructed in accordance with a preferred embodiment of the present invention showing the area of charge trapping under the gate.

A description of what occurs during programming is presented first. In addition, what follows also pertains to the memory cell of FIG. 4 with the silicon dioxide layer with buried polysilicon islands substituting for the nitride layer. During programming, hot electrons are injected into the nitride layer, as described above. Since the nitride is a nonconductor, the trapped charge remains localized to the region near the drain. The region of trapped charge is indicated by the cross hatched area 66 in FIG. 5A. Thus, the threshold voltage rises, for example, to approximately 4 V, only in the portion of the gate over the trapped charge. The threshold voltage of the remainder of the gate remains at, for example, approximately 1 V. If the device is now read in the conventional forward direction (i.e., voltages are applied to the gate and drain as indicated by the arrow in FIG. 5A), electrons move off the source and begin traveling toward the drain. In order to program a '0', there can be little or no channel current through the device when it is read. Thus, only if a sufficient portion of the channel is turned off, can the electron current be stopped. If the channel cannot be completely turned off, the electrons will reach the drain. Whether the electrons reach the drain will be determined by, among other things, the length of the trapped area. If the memory cell is programmed for a sufficiently long period, eventually, the channel stops conducting when read in the forward direction. If the trapped or programmed area is not long enough, electrons can punch through to the drain.

When the device is read in the forward direction a voltage is applied to the drain and the gate, for example 2 V and 3 V, respectively, and the source is grounded. Full inversion occurs in the channel under the area of the nitride that does not have trapped charge. A vertical electric field exists in the channel that spans the length of the channel up to the region of trapped charge. In the inversion region, electrons travel in a linear fashion up to the edge of the inversion region. This is indicated by the line shown in the channel region in Figure 5A that extends from the source to the edge of the region of trapped charge. Due the fact tat the device in inversion (i.e., the channel is in a conductive state), the potential in the inversion layer is pinned to ground potential because the source is grounded. The voltage in the channel near the trapped charge is approximately zero. Thus, the voltage across the region of trapped charge is close to the full drain potential of 2 V. Even in the event tat there is some punch through across the trapped region, the resulting channel current and IR drop are negligible and the majority of the drain potential is still present across the region of trapped charge.

The diagonal line under the channel in FIGS. 2 and 5A indicate the reduction in the number of electrons in the channel as a function of channel distance. The channel region under the trapped charge is off due to the high threshold voltage. However, the region inside the dashed circle in FIG. 2 and the region 66 in FIG. 5A is a depletion region because the device is in saturation (a device will be in saturation when $V_{DS}$, the voltage from drain to source, is higher than $V_{DSAT}$, the saturation voltage). Due to the voltage on the drain, a lateral electric field exists in this region. As a result of this lateral electric field, any electron arriving at the edge of the depletion region will be swept through and pulled to the drain. As described earlier, this phenomena is called punch through. Punch through occurs if the lateral electric field is strong enough to draw electrons through to the drain, regardless of the threshold level. In order to prevent punch through from occurring during a read, the prior art memory devices require a much longer time programing time because they employ reading in the forward direction. As the memory device is programmed for a longer and longer time, more and more electrons are injected into the nitride, increasing the length of the programmed portion of the channel. The device must be programmed for an amount of time that gives a trapped charge region of sufficient length to eliminate the punch through of electrons. When this occurs, the lateral electric field is too weak for electrons to punch through to the drain.

Reading in the Reverse or Backward Direction

However, if the PROM memory cell 10 is read in the backward direction, a very different scenario exists. Reading in the backward direction means reading in a direction opposite than that of programming. In other words, voltage is applied to the source and the gate and the drain is grounded. Similar to the prior an memory device of Figure 5A, the memory device of FIG. 5B is programmed in the forward direction by injecting hot electrons into the nitride layer. Since the nitride is a nonconductor, the trapped charge remains localized to the region near the drain. The region of trapped charge is indicated by the cross hatched area 68 in FIG. 5B. Thus, the threshold voltage rises, for example, to approximately 4 V only in the portion of the gate over the trapped charge. The threshold voltage of the remainder of the gate remains at, for example, approximately 1 V.

To read the device of Figure 5B in the reverse direction, a voltage is applied to the source and the gate, for example 2 V and 3 V, respectively, and the drain is grounded. A major difference between reading in the forward and the backward direction is that when reading in the reverse direction, the gate voltage required to put the memory device into inversion increases significantly. For the same applied gate voltage of 3 V, for example, there will be no inversion but rather the memory device will be in depletion. The reason for this is that a higher gate voltage is needed to generate a sufficient electric field to overcome the charge due to the mobile charge in the inversion layer and the fixed charge in the depletion region. In the case of reading in the reverse direction, in order to sustain a higher voltage in the channel, a much wider depletion region must also be sustained. A wider depletion region translates to more fixed charge that must be compensated for before there can be inversion. For example, to achieve a similar voltage drop across the charge trapping region of the prior art memory device shown in FIG. 5A, a gate voltage of at least 4 V is required. This is in contrast to the prior art memory device where the source was grounded. It took a lower gate voltage to create inversion in tat case. In the memory device of the present invention, a much higher gate voltage is required to pin the voltage in the channel to a higher voltage, i.e., the 2 V that is applied to the source terminal rather than ground. In other words, the significance of the present invention is that for the same potential across the drain and the source, the voltage across the trapped charge region is significantly reduced which directly results in less punch through and much more efficient programming.

The Voltage $V_x$ in the Channel

The voltage $V_X$ is defined as the voltage in the channel at a distance X from the source. Using the example presented above, the voltage $V_x$ that exists in the channel of the memory device of the present invention will not be 2 V because the device is in depletion rather than inversion. On the other end, it must be larger than 0 V because a gate voltage of only 1.5 V is able to sustain approximately 0.4 V in the channel. The actual voltage in the channel varies across the channel length because of the lateral electric field set up between the source and the drain. The threshold voltage, however, varies as a function of the voltage in the channel.

Refering to FIG. 5B, the channel will be in saturation as long as the gate voltage $V_O$ is higher than the threshold voltage $V_T$ and the voltage $V_X$ at any point in the channel is given by $V_{X=DSAT}$ with $V_{DSAT}=V_G-V_T=V_G-V_T(V_{DSAT})$ and $V_T(V_X)=V_{TO}+\Delta V_T(Vx)$ As is shown in the above equations, the threshold voltage in the channel is equal to the threshold voltage with the source at zero potential $V_{TO}$ plus a delta threshold voltage $\Delta V_T$ which is itself a function of the voltage in the channel.

Figure 6:
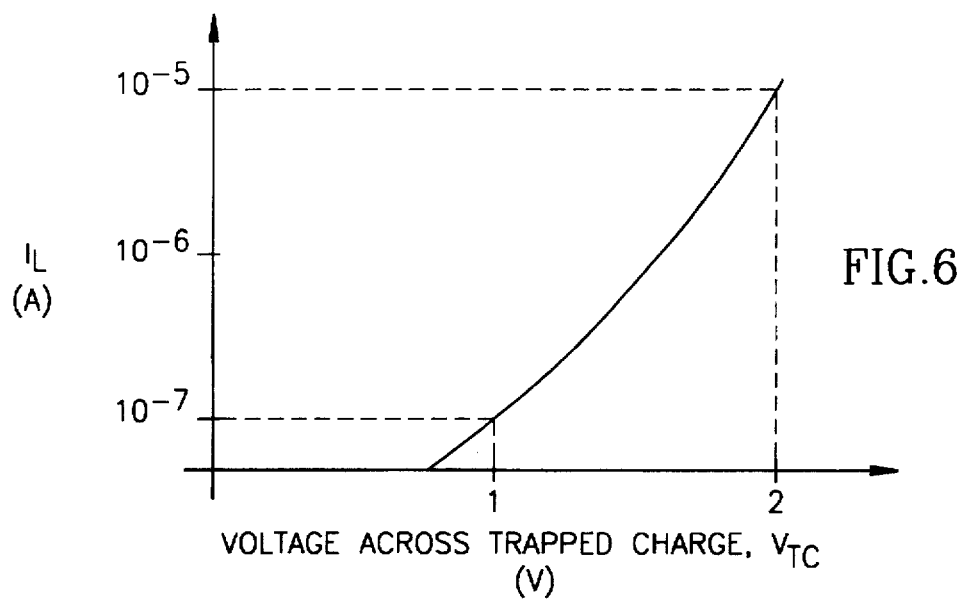
FIG. 6 is a chart illustrating the leakage current through the region of trapped charge as a function of the voltage across the charge trapping region while reading in the backward direction.

The leakage current through the region of trapped charge, plotted as a function of the voltage across the charge trapping region, $V_{TC}$, while reading in the backward direction, is shown in FIG. 6. From the graph, one can see that the approximate leakage current, $I_L$, through the channel when $V_{TC}$ is 2 V is $10^{-5}$ A. In the case of the prior art memory cell, the voltage across the region of trapped charge is approximately 2 V. In contrast, the voltage $V_x$ in the channel of the memory device of the present invention near the region of trapped charge is not 2 V but something less, 1 V for example. The leakage current $I_L$ corresponding to 1 V across the trapped charge region is approximately $10^{-7}$ A, a whole two orders of magnitude smaller.

Figure 7:
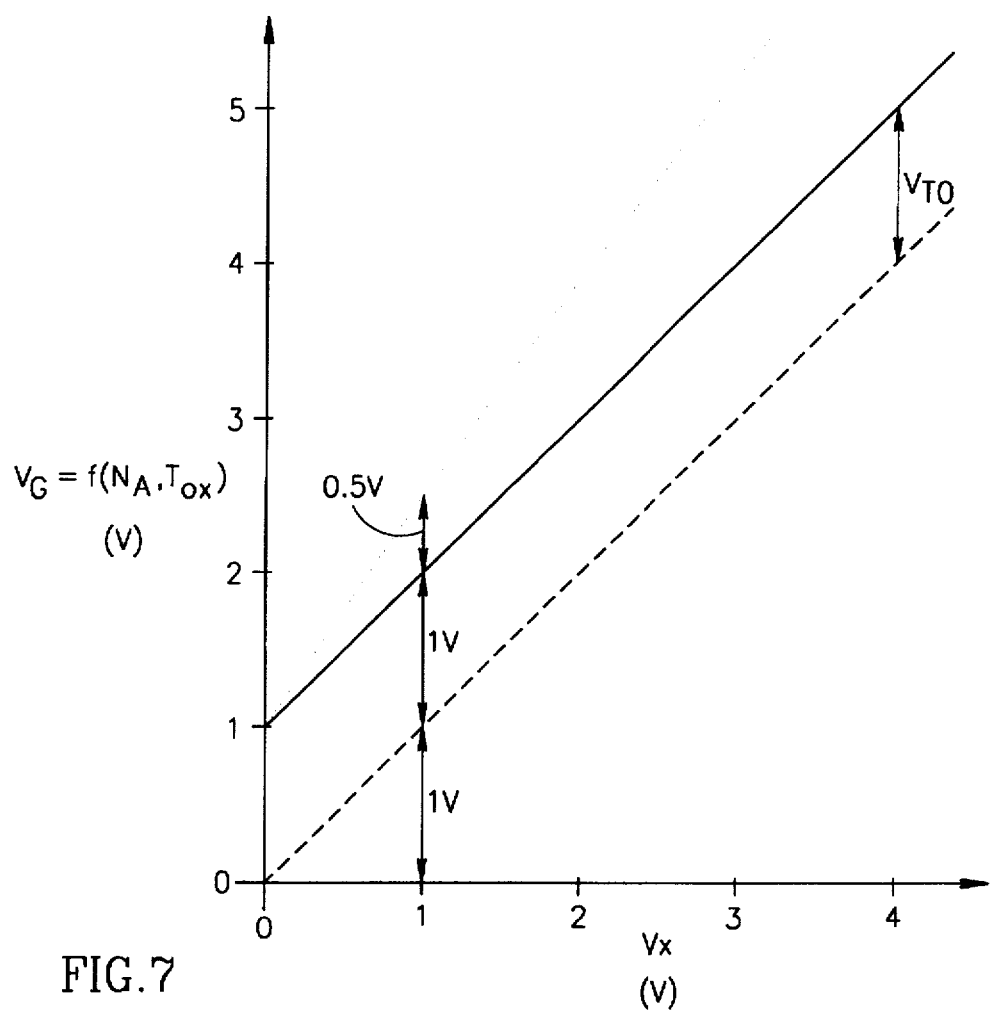
FIG. 7 is a chart illustrating the gate voltage required to sustain a given voltage in the channel $V_x$ next to the region of trapped charge while reading in the backward direction.

A chart illustrating the gate voltage required to sustain a given voltage in the channel, $V_x$, spanning the distance from the drain to the edge of the charge trapping area while reading in the backward direction is shown in FIG. 7. The gate voltage $V_G$ that is required to sustain a particular $V_x$ in the channel is a function of the number of acceptors $N^A$ in the substrate and the thickness of the oxide $T_{OX}$ and is represented by the dotted line. The solid line represents the threshold voltage in the channel that exists when the voltage in the channel is zero. In this case, the threshold voltage is linear across the entire channel. However, once there is a voltage in the channel, the threshold voltage is not constant across the channel. As shown in the graph, the threshold voltage increases nonlinearly as the voltage in the channel increases. The relationship between the incremental increase in threshold voltage as a function of channel voltage is well known in the art, discussion of which can be found in Chapter 2 of *The Design and Analysis of VLSI Circuits* by L. A. Glasser and D. W. Dobberpuhl.

Benefits of Reading in the Reverse Direction

Reading the graph in FIG. 7, one can see that to achieve 2 V in the channel (i.e., the same conditions as the prior art memory device with 3 V applied to the gate) approximately 4 V must be applied to the gate. When, for example, 3 V is applied to the gate and the device is read in the reverse direction, only approximately 1.2 V is generated in the channel. This is in direct contrast to the prior art reading in the forward direction wherein the potential across the trapped charge region was almost the full potential applied to the drain (i.e., 2 V). This is a significant benefit of reading in the reverse direction. The benefit is that for the same gate voltage a much lower potential voltage is present across the region of trapped charge. This results in dramatically less leakage current for the same charge trapping length. Or stated another way, a shorter charge trapping region is needed to achieve an equivalent amount of leakage current. A shorter charge trapping region translates through an exponential function to shorter programming times. A discussion of the variation in programming time with various parameters, voltage and temperature is given in a paper entitled "Hot-Electron Injection Into the Oxide in n-Channel MOS Devices," B. Eitan and D. Frohman-Bentchkowsky, IEEE Transactions on Electron Devices, March 1981.

The effect of the reading the memory device in the backward (i.e., reverse) direction is to amplify the effect of the charge that is injected into the region of trapped charge (i.e., the programmed region or the localized trapping region). For the same programming time, meaning the same length of trapped charge in the nitride, for example as shown in FIGS. 5A and 5B, device 10 exhibits a leakage current $I_L$ approximately two orders of magnitude less than that of a prior art memory cell. As previously discussed, the major benefit is that the programming time can be reduced because the leakage current is significantly less when reading in the reverse direction. Thus, the size of the trapping region does not have to be as long as with prior art memory cells which translates through an exponential function to shorter programing times.

A key advantage of reading in the opposite direction from programming is that the effect of the lateral electric field next to the charge trapping region is minimized. In addition, the gate voltage can be reduced to further minimize the potential in the channel. In fact, as explained in more detail below, the gate voltage can be set to achieve the desired voltage in the channel. This was described previously with reference to FIG. 7. Reducing the gate voltage while reading in the backward direction minimizes the transfer of high voltage to the trapped charge region.

Figure 8A:
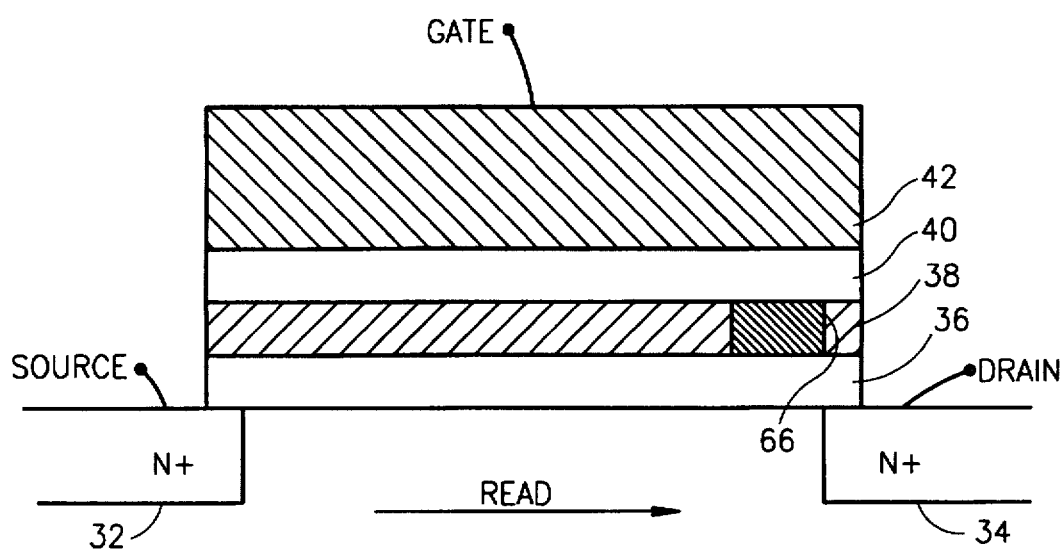
Fig. 8A illustrates a sectional view of a PROM cell of the prior art showing the area of charge trapping under the gate after being programmed for a period of time.
Figure 8B:
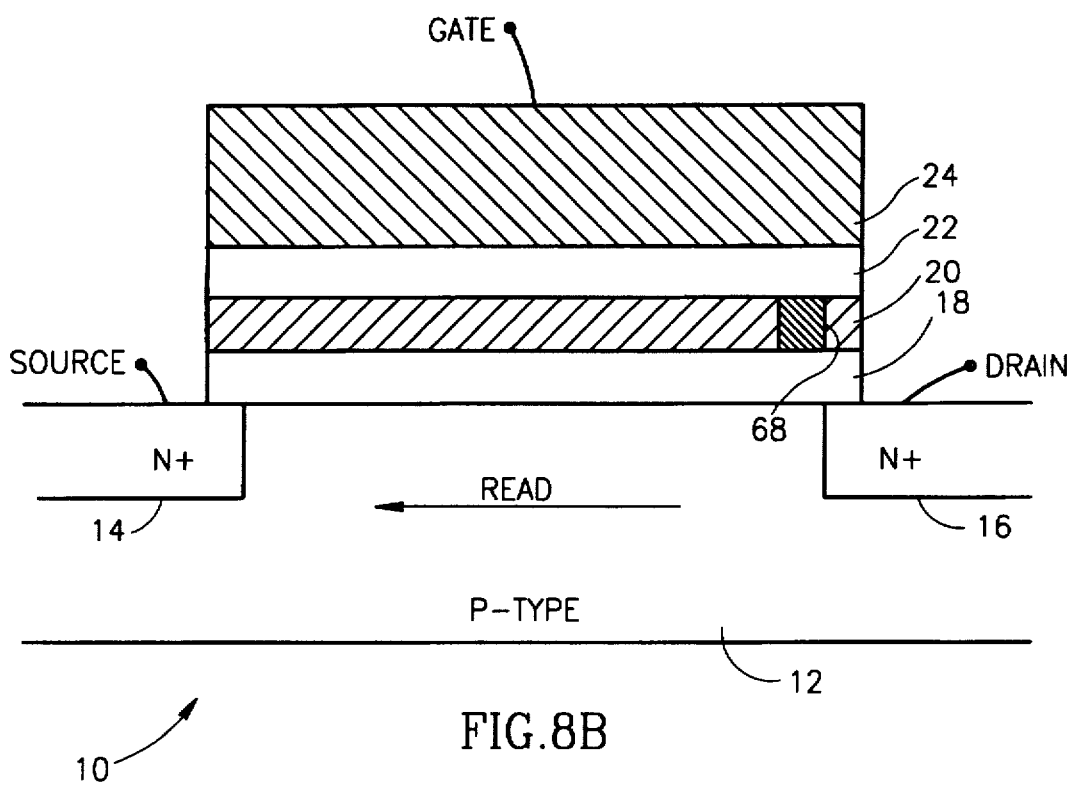
FIG. 8B illustrates a sectional view of a PROM cell constructed in accordance with a preferred embodiment of the present invention showing the area of charge trapping under the gate aft being programmed for a sufficient time to achieve the same threshold voltage of the cell illustrated in Figure 8A.

The area of charge trapping necessary to program memory cell 41 of the prior art is illustrated in FIG. 8A and the area of charge trapping necessary to program memory cell 10 of the present invention is illustrated in Figure 8B. The trapping region 68 of device 10 is shown much smaller than trapping region 66 of the prior art device. As described earlier, reading in the reverse direction permits a shorter charge trapping region. This results in much more efficient programming by reducing, through an exponential function, the programming time of the device. Thus, short programming times are achieved by taking advantage of the asymmetric characteristics of the trapping dielectric PROM memory cell.

The voltage in the channel can be varied by either of two ways. The first is by adjusting the voltage on the gate. A higher gate voltage translates to a higher voltage in the channel. The second way is by adjusting the boron implant level in the silicon substrate. These two methods allow the MOS designer to tailor the voltage in the channel to achieve desired performance margins.

Optimization Parameters

In terms of optimization, there are three parameters that can be varied to give the quickest programing time and the widest margins. The first parameter is the channel length A longer channel length, for a given programming time when reading in the reverse direction, increases the distance between the drain and the trapped charge (effectively, the source and drain designations are flipped). This lowers the level of the lateral electric field even lower.

The second parameter, as described previously, is the gate voltage which can be set to minimize the voltage potential in the channel that exists across the region of trapped charge. This further results in a reduction of the lateral electric field in the channel near the region of trapped charge. Within limits, the voltage in the channel can be 'dialed in' by varying the voltage on the gate. This gives semiconductor circuit designers control over the voltage that is present across the region of trapped charge. If the gate voltage is made too low then reading a '1', i.e., the unprogrammed state, becomes problematic. The gate voltage for reading a '1' must be still high enough to generate inversion in order to produce sufficient read current for the sense amplifiers. Thus, a lower limit for the gate voltage is approximately 1 V above the threshold voltage. An upper limit on the gate voltage is the voltage at which the voltage in the channel across the region of trapped charge is just below the voltage potential applied to the source terminal during reading in the reverse direction. A too high gate voltage will cause inversion in the channel and the benefits of the present invention are lost. Thus, it is not recommended to apply a gate voltage that generates such a high voltage in the channel across the charge trapping region because it defeats the benefits of having a lower potential across this region with the accompanying reduction in leakage current and shortened programming time. In a preferred embodiment of the present invention, the gate voltage used for reading is approximately 3 V which represents an optimized tradeoff between programming time and leakage current.

The third optimization method, previously described and which is known in the art, is to vary the boron doping of the channel region under the gate. An increase in the doping concentration results in a lower voltage generated in the channel. This is due to the reduction in the width of the depletion region formed. Thus, a higher doping concentration permits a higher gate voltage to be applied for the same voltage across the charge trapping region.

In addition, an increase in the NA doping concentration for the same length trapping region will improve the punch through behavior of the device. By varying the level of boron implanting of the channel region, the width of the depletion region under the gate can be varied. An increase in the doping concentration results in a reduction in the width of the depletion region for the same applied gate voltage. The reduction in the width of the depletion occurs because there is now more fixed charge in the substrate. Thus, varying the doping concentration can be used to limit the length of the pinchoff region under the gate. In addition, the doping concentration can be used to increase or decrease the initial threshold voltage of the device.

While the invention has been described with respect to a limited number of embodiments, it will be appreciated that many variations, modifications and other applications of the invention may be made.

What is claimed is:

1. A programmable read only memory (PROM) device, comprising:

a semiconducting substrate of a first conductivity type;

a source, said source comprising a region of said semiconducting substrate doped to have a conductivity opposite that of said semiconducting substrate;

a drain, spaced from said source, said drain comprising a portion of said semiconducting substrate doped to have a conductivity opposite that of said semiconducting substrate, a channel being formed in the space between said source and said drain within said semiconducting substrate;

a first insulating layer overlaying and covering said channel portion of said semiconducting substrate;

a nonconducting charge trapping layer formed on and overlaying said first insulating layer;

a second insulating layer formed on and overlaying said nonconducting charge trapping layer;

a gate, said gate comprising an electrically conductive material formed on and overlaying said second insulating layer; and wherein said charge trapping layer is formed so as to receive and retain electrons injected into said charge trapping layer in a charge storage region close to said drain forming a bit, the quantity of electrons so stored being selected so as to provide said cell with a first threshold voltage greater than first selected value when said memory cell is read in a first direction opposite to that in which it was programmed and to Provide said cell with a second threshold voltage when said memory cell is read in a second direction which is the same direction in which it was programmed, said second threshold voltage being substantially lower than said first threshold voltage.

2. The memory device according to claim 1, wherein a lower limit for the voltage applied to said gate during reading is the voltage at which sufficient inversion is generated in the channel whereby the unprogrammed state can be sensed, an upper limit for the voltage applied to said gate during reading is the voltage at which the voltage across a region of said channel beneath the trapped charge in said charge storage region is below the voltage applied to said source during reading.

3. The memory device according to claim 1, wherein programming said bit comprises applying programming voltages to said drain and said gate, grounding said source and measuring the resulting channel current and wherein reading said bit comprises applying reading voltages to said source and said gate, grounding said drain and measuring the resulting channel current reading;

4. The memory device according to claim 1, wherein said first and second insulating layers comprise silicon dioxide.

5. The memory device according to claim 1, wherein said charge trapping layer comprises silicon nitride.

6. The memory device according to claim 1, wherein said charge trapping layer comprises silicon dioxide with buried polysilicon islands.

7. The memory device according to claim 1, wherein said semiconducting substrate comprises P-type semiconductor material.

8. The memory device according to claim 1, wherein said source and said drain comprise N+ semiconductor.

9. A programmable read only memory (PROM) device, comprising:

semiconducting substrate of a first conductivity type;

a source, said source comprising a region of said semiconducting substrate doped to have a conductivity opposite that of said semiconducting substrate;

a drain, spaced from said source, said drain comprising a region of said semiconducting substrate doped to have a conductivity opposite that of said semiconducting substrate, a channel being formed between said source and said drain within said semiconducting substrate;

a first insulating layer overlaying and covering said channel portion of said semiconducting substrate;

a nonconducting charge trapping layer formed on and overlaying said first insulating layer;

a second insulating layer formed on and overlaying said nonconducting charge trapping layer;

a gate, said gate comprising an electrically conductive material formed on and overlaying said second insulating layer;

wherein said cell is adapted to receive and retain electrons injected into said nonconducting charge trapping layer in a region close to said source forming a bit; and wherein said memory is adapted to be read in a direction opposite to that in which it was programmed, such that a lower limit for the voltage applied to said gate during reading said bit is the voltage at which sufficient inversion is generated in said channel whereby an unprogrammed state can be sensed, an upper limit for the voltage applied to said gate during reading said bit is the voltage at which the voltage across a region of said channel beneath the trapped charge in said charge storage region is below the voltage applied to said source during reading said bit.

10. The memory device according to claim 9, wherein said bit of said memory cell is adapted to be programmed by applying programming voltages to said drain and said gate, grounding said source and measuring the resulting channel current and wherein said bit of said memory cell is adapted to be read by applying reading voltage to said source and said gate, grounding said drain and measuring the resulting channel current.

11. The memory device according to claim 9, wherein said first and second insulating layers comprise silicon dioxide.

12. The memory device according to claim 9, wherein said charge trapping layer comprises silicon nitride.

13. The memory device according to claim 9, wherein said charge trapping layer comprises silicon dioxide with buried polysilicon islands.

14. The memory device according to claim 9, wherein said semiconducting substrate comprises P-type semiconductor material.

15. The memory device according to claim 9, wherein said source and said drain comprise N+ semiconductor material.

16. A method of programming and reading a programmable read only memory (PROM) cell, said PROM cell having a semiconducting substrate, source, drain with a channel therebetween and a gate above said channel separated therefrom by a nonconducting charge trapping material sandwiched between first and second silicon dioxide layers, said method comprising the steps of:

programming in a forward direction by injecting electrical charge into said charge trapping material utilizing hot electron injection for a sufficient time that electrical charge becomes trapped asymmetrically in a charge trapping region of said charge trapping material close to said drain forming a bit, said electric charge being injected until the threshold voltage of said memory gate reaches a predetermined level when said memory cell is read in the reverse direction from which it was programmed;

said asymmetrical charge injection for said bit being generated by applying programming voltages to said drain and said gate and grounding said source; and reading in reverse direction by applying read voltages to said source and said gate and grounding said drain, and subsequently sensing whether or not current flows through said memory cell from said source to said drain.

17. The method according to claim 16, wherein a lower limit for said reading voltage applied to said gate during said step of reading said bit is the voltage at which sufficient inversion is generated in said channel whereby the unprogrammed state can be sensed, an upper limit for said reading voltage applied to said gate during said step of reading said bit is the voltage at which the voltage across a region of said channel beneath the trapped charge in said storage is below the voltage applied to said source during, reading of said bit.

18. The memory cell according to claims 1 or 9, wherein the amount of charge stored in said region of trapped charge for said bit in said nonconducting charge trapping layer is such that the change in threshold voltage for reading in the reverse direction relative to reading in the forward direction is greater than a factor of ten.

19. The memory cell according to claims 1 or 9, wherein the amount of charge stored in said region of trapped charge for said bit in said nonconducting charge trapping layer is such that the change in threshold voltage for reading in the reverse direction relative to reading in the forward direction is greater than a factor of five.

20. The memory cell according to claims 1 or 9, wherein the amount of charge stored in said region of trapped charge for said bit in said nonconducting charge trapping layer is such that the change in threshold voltage for reading in the reverse direction relative to reading in the forward direction is greater than a factor of two.

21. The memory cell according to claims 1 or 9, wherein the amount of charge stored in said region of trapped charge for said bit in said nonconducting charge trapping layer is such that the change in threshold voltage for reading in the reverse direction relative to reading in the forward direction is greater than a factor of one and one half.

22. The memory cell according to claims 1 or 9, wherein said charge trapping layer comprises silicon dioxide with impurities therein.

23. A programmable read only memory (PROM) cell, comprising:

a semiconductor substrate of a first conductivity type containing therein a source region and a drain region each of a second conductivity type opposite to said first conductivity type and separated from each other by a channel region normally of said first conductivity type;

a dielectric formed over said channel region, said dielectric being capable of holding selected charge in a portion thereof above and adjacent to said drain region, said dielectric including a first layer of silicon oxide, a second layer of silicon oxide and a charge trapping material formed between said first layer of silicon oxide and said second layer of silicon oxide;

a gate comprising an electrically conductive layer formed on and overlaying said dielectric;

a first voltage source capable of being connected to said drain, a second voltage source capable of being connected to said gate and a third voltage source capable of being connected to said source; and a control both for causing said first voltage source to apply a first voltage to said drain, said second voltage source to apply a second voltage to said gate, and said third voltage source to apply a third voltage to said source, thereby to cause electrons to be injected by hot electron injection into said portion of said dielectric and for causing said first voltage source to apply a fourth voltage to said drain, said second voltage source to apply a fifth voltage to said gate and said third voltage source to apply a sixth voltage to said source thereby to cause said memory cell to read in the reverse direction from the direction in which the cell was programmed.

24. The memory cell according to claim 23, wherein said charge trapping material comprises silicon nitride, said layer of silicon nitride being of such a thickness as to receive and retain a selected charge in a localized portion of said silicon nitride, and wherein the remainder of said dielectric is adapted to assist in retaining the charge in the silicon nitride in said portion of the silicon nitride in which the charge is formed.

25. The memory cell according to claim 24 wherein said first layer of silicon oxide is formed between said silicon nitride layer and said semiconductor substrate and said second layer of silicon oxide is formed between said silicon nitride layer and said gate.

26. The memory cell according to claim 23 wherein said semiconductor substrate comprises silicon and said first layer of silicon oxide is formed by thermally oxidizing said semiconductor substrate.

27. The memory cell according to claim 23, wherein said charge trapping region comprises silicon nitride, said second layer of silicon oxide is formed at least in part by thermally oxidizing a top portion of the layer of said silicon nitride.

28. The memory cell according to claim 23, wherein said second layer of silicon oxide comprises at least a portion formed from the deposition of silicon dioxide.

29. The memory cell according to claim 23 wherein said second layer of silicon oxide is formed at least in part by die deposition of silicon dioxide from TEOS.

30. The memory cell according to claim 24, wherein said second layer of silicon oxide is formed by at least one of the following: thermal oxidation of the top surface of said silicon nitride layer, the chemical vapor deposition of silicon dioxide from selected reactants or the deposition of silicon dioxide from the decomposition of TEOS.

31. The memory cell according to claim 23, wherein said dielectric comprises a selected layer of silicon dioxide formed with selected pockets of polycrystalline silicon dispersed therein, said pockets of polycrystalline silicon being capable of retaining a charge lodged in said polycrystalline silicon.

32. The memory cell according to claim 23, wherein said dielectric comprises selected impurities which are capable of retaining a charge.

33. The memory cell according to claim 23, wherein said dielectric comprises a pocket of polycrystalline silicon located adjacent the drain region of said cell, said pocket of polycrystalline silicon being capable of storing trapped charges.

34. The memory cell according to claim 23, wherein said dielectric comprises at least a portion thereof formed by depositing silicon dioxide in a silicon rich environment such that precipitates of silicon form randomly but are dispersed throughout a portion of the silicon dioxide layer, said precipitates of silicon serving to hold trapped charge injected into said portion of said silicon dioxide layer.

35. A semiconductor memory cell, comprising:

a substrate of a first conductivity type including a source region of a second conductivity type opposite the said first conductivity type and a drain region of said second conductivity type, said source and drain being respectively spaced from each other by a channel region normally of said first conductivity type formed therebetween;

dielectric capable of holding an electrical charge in a charge trapping region thereof formed over said channel region;

a conductive gate formed over said dielectric;

means for applying a first voltage to said source region and a second voltage to said gate region thereby to cause electrons to be lodged on and stored in said charge trapping region associated with the said dielectric; and means for applying a third voltage to said source and a fourth voltage to said gate thereby to cause a current to be read indicating the presence or absence of a stored charge in said dielectric, the fourth voltage being between a fifth voltage sufficient to invert said channel with no charge in said charge trapping region and a sixth voltage sufficient to create a voltage beneath said third voltage at a point in said channel beneath an edge of said charge trapping region with charge stored therein.

36. The memory cell according to claim 35 wherein said dielectric further comprises, a first layer of silicon dioxide formed on said substrate:

a layer of silicon nitride formed on said first layer of silicon dioxide, said layer of silicon nitride being capable of retaining charge in a selected portion thereof; and a second layer of silicon dioxide formed on said silicon nitride, said second layer of silicon dioxide assisting said silicon nitride in retaining the charge trapped in the charge trapping region thereof despite the electric fields generated therein.

37. A programmable read only memory (PROM) cell, comprising:

a semiconductor substrate of a first conductivity type;

a source comprising a region of said semiconducting substrate doped to have a conductivity opposite that of said semiconducting substrate;

a drain spaced from said source, comprising a region of said semiconducting substrate doped to have a conductivity opposite that of said semiconducting substrate;

a channel formed in the space between said source and said drain within said semiconducting substrate;

a first insulating layer overlaying and covering said channel;

a non conducting charge trapping layer formed on and overlaying said first insulating layer;

a second insulating layer formed on and overlaying said non conducting charge trapping layer;

a gate comprising an electrically conductive material formed on and overlaying said second insulating layer; and wherein said charge trapping layer is formed so as to receive and retain a first selected amount of charge in a region of said non-conducting, charge-trapping layer close to and above said drain, said charge-trapping layer comprising a layer of silicon nitride having a thickness selected to ensure that the lateral electric field associated with the trapped charge is below the lateral electric field which would cause significant lateral diffusion of the stored charge and said first selected amount of charge is sufficient to cause a desired increase in the threshold voltage required to invert said channel when said cell is read in the reverse direction but is not sufficient to cause the same desired increase in the threshold voltage required to invert the channel when the cell is read in the forward direction.

38. The memory cell according to claim 37, wherein the thickness of the silicon nitride is selected to reduce the lateral electric field within the charge storage region to beneath a selected value thereby to reduce the lateral diffusion of the stored charge in the silicon nitride and thereby to limit the reduction in the threshold voltage of the portion of the channel beneath said charge storage region due to this lateral diffusion to less than a selected amount.

39. The memory cell according to claim 38, wherein the reduction in the threshold voltage of the portion of the channel beneath said charge storage region due to lateral diffusion of the stored charge is less than ten percent of the threshold voltage of this portion of the channel before the lateral diffusion.

40. The memory cell according to claim 38, wherein the reduction in the threshold voltage of the portion of the channel beneath said charge storage region due to lateral diffusion of the stored charge is less than five percent of the threshold voltage of this portion of the channel before the lateral diffusion.

* * * * *